United States Patent [19]

Goetting

[11] Patent Number: 4,812,675
[45] Date of Patent: Mar. 14, 1989

[54] SECURITY ELEMENT CIRCUIT FOR PROGRAMMABLE LOGIC ARRAY

[75] Inventor: Erich Goetting, Cupertino, Calif.

[73] Assignee: Exel Microelectronics Incorporated, San Jose, Calif.

[21] Appl. No.: 38,276

[22] Filed: Apr. 15, 1987

[51] Int. Cl.⁴ ............... H03K 17/16; H03K 19/94; G06F 7/22

[52] U.S. Cl. ................ 307/443; 307/451; 307/465; 307/296 A; 364/200; 364/900

[58] Field of Search ........ 307/443, 451, 465, 468–469, 307/296.4; 364/200, 900; 377/66

[56] References Cited

U.S. PATENT DOCUMENTS 4,684,830  8/1987  Tsui et al. ................ 307/465

FOREIGN PATENT DOCUMENTS 0016145  2/1979  Japan ................ 371/66

Primary Examiner—John S. Heyman
Assistant Examiner—M. R. Wambach
Attorney, Agent, or Firm—Townsend and Townsend

[57] ABSTRACT

An improved security circuit for a programmable logic array. One of the programmable elements of the array is designated as a security element, and its output is coupled to a latching mechanism. The output of the latching mechanism is coupled to a mechanism for disabling the read output of the array. The latching mechanism is enabled for a short time by a pulse when power is applied to the circuit. Thus, when power is first applied, the security fuse has not been set and the latch output will allow data to be read. While power is applied, all of the programmable elements can be set, including the security element. All the elements, including the security fuse, can then be verified by reading them out. When power is turned off and subsequently reapplied, the latch will then be enabled and the set security fuse level will appear at the latch output, thereby disabling the reading out of the program data. The present invention thus allows verification of the setting of the security fuse and verification of the other programmable elements after the security fuse has been set.

7 Claims, 2 Drawing Sheets

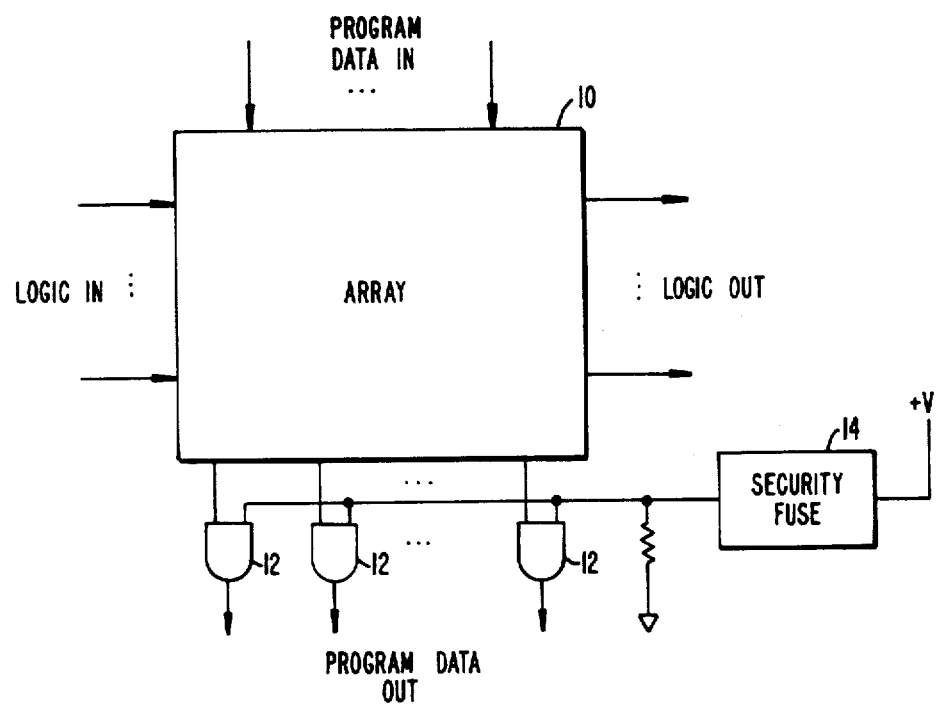
FIG._1.

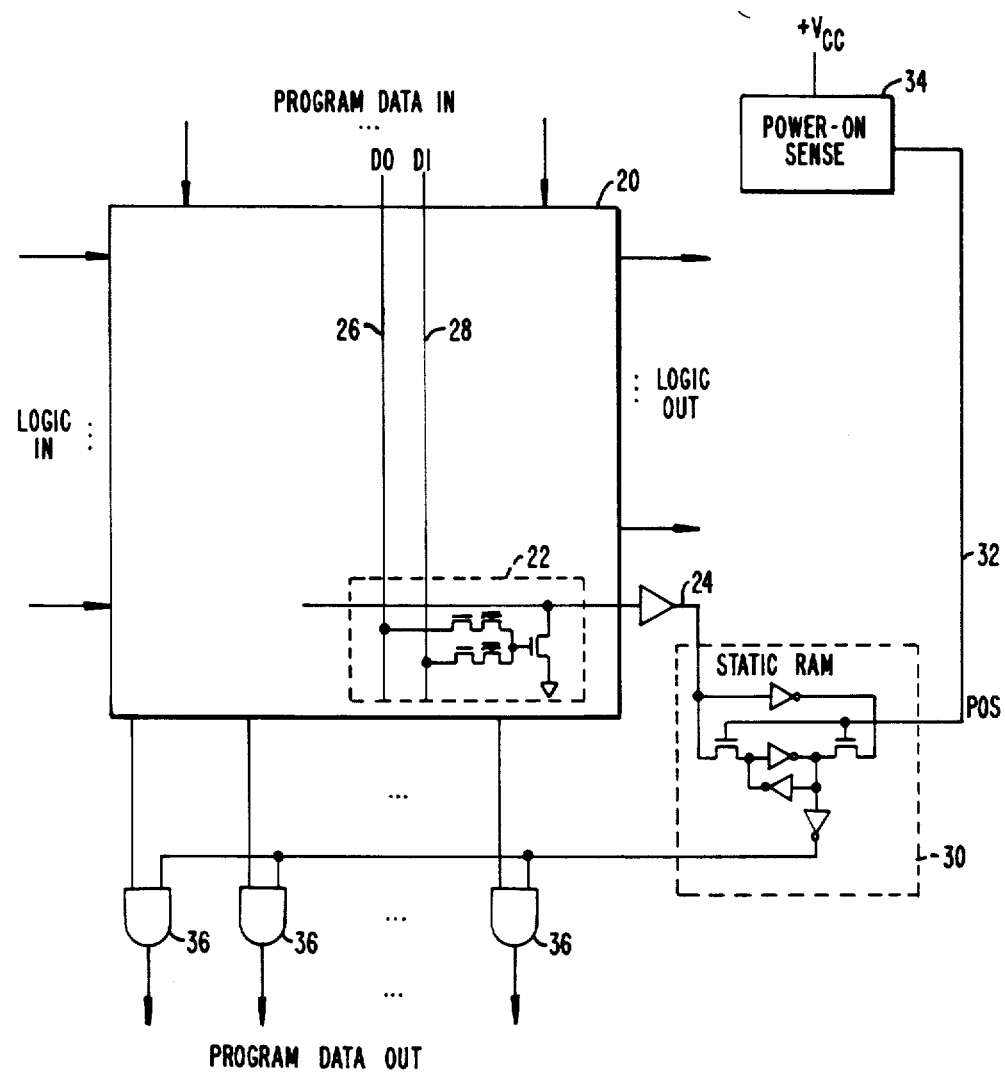
FIG._2.

SECURITY ELEMENT CIRCUIT FOR PROGRAMMABLE LOGIC ARRAY

BACKGROUND

The present invention relates to security fuses for programmable logic array devices.

Programmable logic devices typically use fuses or memory cells which serve to provide desired connections to form a logic network. The fuses or memory cells are blown or written into (programmed) in accordance with the desired logic function. To verify that the circuit has been correctly configured, this fuse or memory array can then be read to check the programming.

In order to prevent competitors from reading out the programming of the logic chip, a security fuse is often used. The security fuse, when programmed, disables the reading of the memory or fuse array.

A typical prior art configuration is shown in FIG. 1. A memory array 10 is programmed with data inputs so that it will perform logic functions between logic inputs and logic outputs. The program data out from memory array 10 is ANDed in a series of AND gates 12 with a signal from a security fuse 14. When security fuse 14 is blown, or written to, a zero logic level will be presented to one input of each of AND gates 12. This disables the gate outputs and provides for an all zero data output reading regardless of the actual configuration of memory array 10, thus preventing a competitor from getting the program.

The arrangement of FIG. 1 requires that the programmer verify the programming prior to setting the security fuse. Once the security fuse is set, the programmed information can no longer be verified. In the event that the setting of the security fuse causes an error elsewhere in the circuit, this will not be detectable during a program verification. Typically, security fuse 14 is located in memory array 10 near other data fuses and it could cause errors in other data elements when it is set if there is a defect.

SUMMARY OF THE INVENTION

The present invention is an improved security circuit for a programmable logic array. One of the programmable elements of the array is designated as a security element, and its output is coupled to a latching mechanism. The output of the latching mechanism is coupled to a mechanism for disabling the read output of the array. The latching mechanism is enabled for a short time by a pulse when power is applied to the circuit.

Thus, when power is first applied, the security element has not been set and the latch output will allow data to be read. While power is applied, all of the programmable elements can be set, including the security element. All the elements, including the security element, can then be verified by reading them out. When power is turned off and subsequently reapplied, the latch will then be enabled and the set security element level will appear at the latch output, thereby disabling the reading out of the program data. The present invention thus allows verification of the setting of the security element and verification of the other programmable elements after the security element has been set.

Preferably, the latch used is a static RAM cell which has an enable input provided from a power-on sense (POS) circuit. The POS circuit detects when applied power reaches a certain level and applies a pulse to the enable input of the static RAM.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram of a programmable logic array using a security element according to the prior art; and FIG. 2 is a combination block and schematic diagram showing a security element circuit according to the present invention.

DETAILED DESCRIPTION OF THE PREFERRED EMBODIMENT

FIG. 2 shows a memory array 20 which includes a memory element 22 coupled to an output line 24. Element 22 is designated as the security fuse element and is programmed by inputs along architecture columns 26, 28.

An example of an array 20 is shown in co-pending application Ser. No. 856,539, filed Apr. 25, 1986, and entitled "A Configurable Logic Array Circuit." A sample of a configuration for memory cell 22 is shown in co-pending application Ser. No. 856,623, filed Apr. 25, 1986, and entitled "A Programmable Matrix Circuit." These applications are hereby incorporated herein by reference.

Output line 24 is provided to a static RAM cell 30. Static RAM 30 is provided an enable input along a line 32 from a power-on sense circuit 34. The output of static RAM cell 30 is provided as one input to a series of AND gates 36. The other input of each AND gate is one of the data outputs from memory array 20. The output of the AND gates are provided to the data out lines of a chip containing the circuit.

Power-on sense circuit 34 detects when the applied power to the circuit has reached a certain level, and provides a high-going pulse on line 32. The level of the power which is detected is necessarily above the threshold operating level of the power-on sense circuit itself.

On initial power-up, the signal from power-on sense circuit 34 enables static RAM 30 which has a high level applied to its input and thus enables all of AND gates 36. Since the signal from power-on sense circuit 34 was a pulse, after it has passed, the output of static RAM 30 will not change until the pulse reappears on the next power-up. Accordingly, memory array 20 can then be programmed, including security element cell 22. This programming can then be verified since all of AND gates 36 are enabled. After all the programming has been verified and power is turned off, upon the next power-up the zero level present at the input of static RAM 30 due to the programming of cell 22 will be provided to AND gates 36 by the pulse from power-on sense circuit 34. Thus, after verification of the array contents, upon its next power-up by someone attempting to read the contents, another pulse will be presented by power-on sense circuit 34. This will pass the zero level from programmed cell 22 to the inputs of AND gates 36, thereby disabling the outputs of AND gates 36. Thus, the data will be protected and cannot be read.

As will be understood by those familiar with the art, the present invention may be embodied in other specific forms without departing from the spirit or essential characteristics thereof. For example, a standard latch could be used instead of a static RAM or logic other than AND gates could be used to disable the outputs of the array. Accordingly, the disclosure of the preferred embodiment of the invention is intended to be illustrative, but not limiting, of the scope of the invention which is set forth in the following claims.

What is claimed is:

1. An improved security circuit for a programmable logic array having a plurality of programmable elements for providing output signals on logic outputs of said array responsive to input signals on logic inputs to said array in accordance with programmed values of said programmable elements and having programming inputs to said programmable elements for programming said programmable elements and programming outputs from said programmable elements for verifying said programmed values, comprising:
   a programmable security element for providing a security signal at a security output;
   latching means, coupled to said security output, for storing a signal from said security output upon receiving an enable pulse at an enable input;
   power-on sense means for providing said enable pulse to said latching means for a short period when power is applied to said programmable logic array; and
   means, responsive to an output of said latching means, for disabling the reading of said programmed values of said programmable elements on said programming outputs.

2. The circuit of claim 1 wherein said latching means comprises a static RAM.

3. The circuit of claim 1 wherein said power-on sense means comprises a power-on sense circuit which provides a high-going enable pulse when a power input for said array exceeds a predetermined level.

4. The circuit of claim 1 wherein said means for disabling comprises a series of AND gates, each AND gate having one input coupled to a programming output of said array and another input coupled to an output of said latching means.

5. An improved security circuit for a programmable logic array having a plurality of programmable elements for providing output signals on logic outputs of said array responsive to input signals on logic inputs to said array in accordance with programmed values of said programmable elements and having programming inputs to said programmable elements for programming said programmable elements and programming outputs from said programmable elements for verifying said programmed values, comprising:
   a static RAM, coupled to a security output of said array, said static RAM having an enable input, said security output being coupled to an element in said array designated as a security element;
   power-on sense means for providing an enable pulse to said enable input of said static RAM upon a power supply for said array reaching a predetermined level; and
   a plurality of AND gates, each AND gate having one input coupled to one of said programming outputs of said array and another input coupled to an output of said static RAM.

6. The circuit of claim 5 wherein each of said programmable elements comprises an EEPROM memory cell.

7. A method for securing the programming of a programmable logic array having a plurality of programmable elements for providing output signals on logic outputs of said array responsive to input signals on logic inputs to said array in accordance with programmed values of said programmable elements and having programming inputs to said programmable elements for programming said programmable elements and programming outputs from said programmable elements for verifying said programmed values, comprising the steps of:
   programming said elements of said array, including an element designated as a security element;
   reading the contents of said array on said programming outputs to verify said programming;
   removing power from said array;
   reapplying power to said array;
   detecting the reapplication of said power and providing an enable pulse signal;
   latching a security output of said array corresponding to said security element, in response to said enable pulse signal, to an output of a latch circuit; and
   disabling the reading of said programming outputs of said array in response to an output of said latch circuit.

* * * * *